(12) United States Patent
Fujimura

(10) Patent No.: US 11,683,010 B2
(45) Date of Patent: Jun. 20, 2023

(54) OSCILLATION CIRCUIT

(71) Applicant: ABLIC Inc., Tokyo (JP)

(72) Inventor: Manabu Fujimura, Tokyo (JP)

(73) Assignee: ABLIC Inc., Tokyo (JP)

( * ) Notice: Subject to any disclaimer, the term of this patent is extended or adjusted under 35 U.S.C. 154(b) by 0 days.

(21) Appl. No.: 17/870,856

(22) Filed: Jul. 22, 2022

(65) Prior Publication Data

US 2023/0031567 A1  Feb. 2, 2023

(30) Foreign Application Priority Data

Jul. 29, 2021 (JP) .............................. JP2021-123773

(51) Int. Cl.
*H03K 3/354* (2006.01)
*H03B 5/04* (2006.01)
*H03B 5/24* (2006.01)

(52) U.S. Cl.
CPC .............. *H03B 5/04* (2013.01); *H03B 5/24* (2013.01); *H03K 3/354* (2013.01)

(58) Field of Classification Search
CPC ....................................................... H03K 3/354
USPC ............................................................ 331/111
See application file for complete search history.

(56) References Cited

U.S. PATENT DOCUMENTS 7,068,116 B2    6/2006  Kato et al.
2017/0117882 A1*  4/2017  Motz ....................... H03K 3/354
2020/0343858 A1* 10/2020  Matsuno ................. H03K 4/502

FOREIGN PATENT DOCUMENTS

JP          2005217762       8/2005

* cited by examiner

*Primary Examiner* — Joseph Chang
(74) *Attorney, Agent, or Firm* — JCIPRNET

(57) ABSTRACT

An oscillation circuit includes first and second constant current circuits, first and second switch circuits, first and second MOS transistors, and an output port. The first constant current circuit is connected to one port of a capacitor. The first MOS transistor has a gate and a drain connected to the second constant current circuit and a source connected to another port of the capacitor. The second MOS transistor has a gate connected to the gate of the first MOS transistor, and a drain connected to the one port of the capacitor. The second switch circuit is connected between a source of the second MOS transistor and a second power supply terminal. The output port outputs a signal based on a voltage of the one port. Turn-on and turn-off of the first and second switch circuits are controlled by the signal of the output port and an inverted signal.

3 Claims, 4 Drawing Sheets

US 11,683,010 B2

OSCILLATION CIRCUIT

CROSS-REFERENCE TO RELATED APPLICATION

This application claims the priority benefit of Japan application serial no. 2021-123773, filed on Jul. 29, 2021. The entirety of the above-mentioned patent application is hereby incorporated by reference herein and made a part of this specification.

BACKGROUND

Technical Field

The present invention relates to an oscillation circuit.

Related Art

An oscillation circuit is required to output a constant frequency without being affected by fluctuations in the power supply voltage and the temperature.

FIG. 4 is a circuit diagram illustrating a conventional oscillation circuit.

The oscillation circuit 400 of FIG. 4 includes a capacitor C1, inverters 41, 42, and 44, a bandgap constant voltage circuit 43 (hereinafter referred to as a BGR circuit), a constant current source circuit 45, a constant current bias generation circuit 46, a PMOS transistor M1, and an NMOS transistor M2.

The BGR circuit 43 supplies a voltage VBGR which is not affected by fluctuations in the power supply voltage and the temperature. The constant current source circuit 45 bias-controlled by the constant current bias generation circuit 46 generates a constant current which is not affected by fluctuations in the power supply voltage and the temperature. Since the voltage VBGR and the constant current control the voltage of the capacitor C1, the oscillation circuit of FIG. 4 can output a constant frequency from the inverter 42 without being affected by fluctuations in the power supply voltage and the temperature.

However, since the above oscillation circuit includes the BGR circuit 43 and the constant current bias generation circuit 46, the circuit scale of these circuits is large and the current consumption is large.

SUMMARY

An oscillation circuit according to an embodiment of the present invention includes a capacitor, a first constant current circuit, a first switch circuit, a second constant current circuit, a first MOS transistor, a second MOS transistor, a second switch circuit, and an output port. The first constant current circuit is connected between a first power supply terminal and one port of the capacitor. The first switch circuit is connected between another port of the capacitor and a second power supply terminal. The second constant current circuit has one port connected to the first power supply terminal. The first MOS transistor has a gate and a drain connected to another port of the second constant current circuit and a source connected to the another port of the capacitor. The second MOS transistor has a gate connected to the gate of the first MOS transistor and a drain connected to the one port of the capacitor. The second switch circuit is connected between a source of the second MOS transistor and the second power supply terminal. The output port outputs a signal based on a voltage of the one port of the capacitor. Turn-on and turn-off of the first switch circuit and the second switch circuit are controlled by the signal of the output port and an inverted signal of the signal.

The oscillation circuit of the present invention includes the NMOS transistors and the switch circuits which raise and lower the voltage of the capacitor by a constant voltage, and the constant current circuits which charge and discharge the capacitor by a constant current. Therefore, it is possible to provide an oscillation circuit which has a small circuit scale and a small current consumption but can output a constant frequency without being affected by fluctuations in the power supply voltage and the temperature.

DESCRIPTION OF THE EMBODIMENTS

Embodiments of the present invention provide an oscillation circuit capable of outputting a constant frequency without being affected by fluctuations in the power supply voltage and the temperature, even if the circuit scale is small and the current consumption is small.

Hereinafter, an oscillation circuit of the present invention will be described with reference to the drawings.

Figure 1:
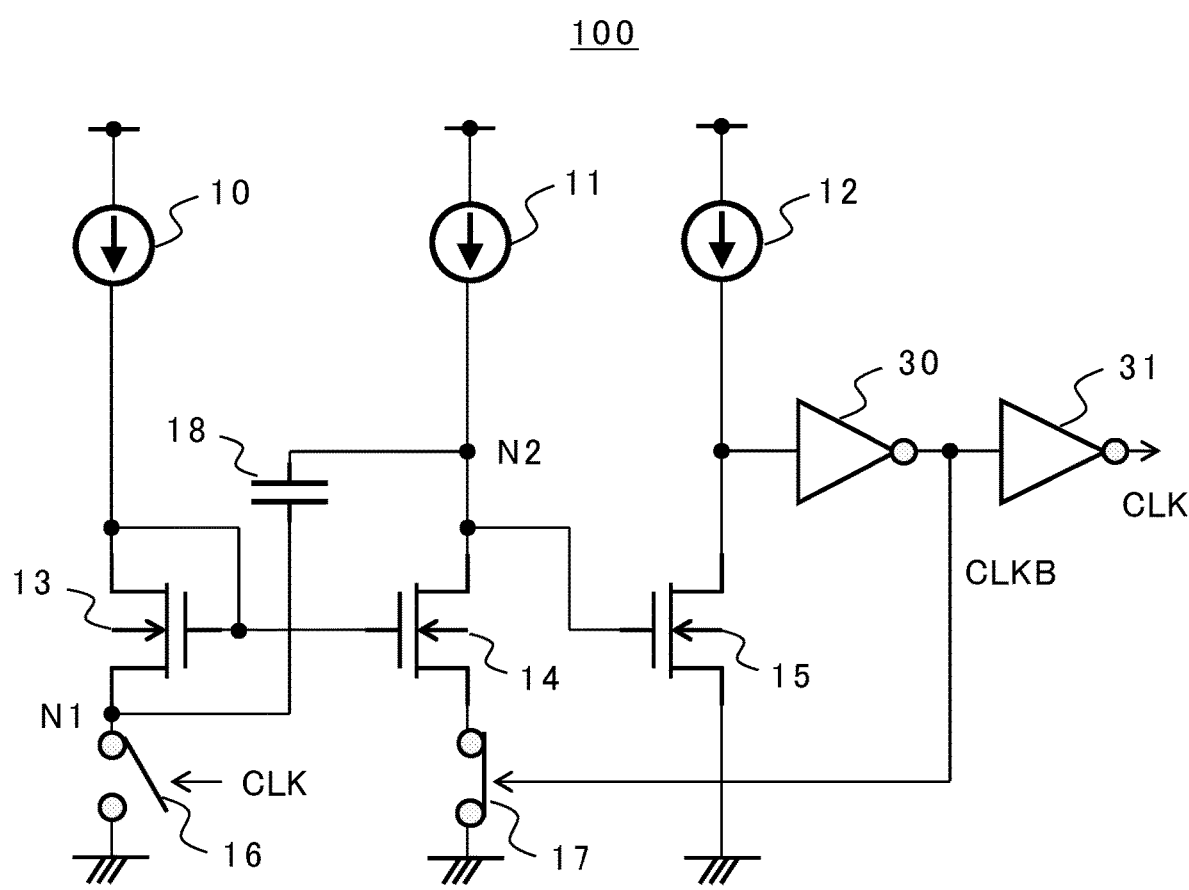
FIG. 1 is a block diagram illustrating an oscillation circuit of the present embodiment.

FIG. 1 is a block diagram illustrating an oscillation circuit 100 of the present embodiment.

The oscillation circuit 100 of FIG. 1 includes constant current circuits 10, 11, and 12, NMOS transistors 13, 14, and 15, switch circuits 16 and 17, a capacitor 18, and inverters 30 and 31. The constant current circuit 12 and the NMOS transistor 15 constitute a constant current inverter.

One port of each of the constant current circuits 10, 11, and 12 is connected to a power supply terminal. The drain and the gate of the NMOS transistor 13 are connected to another port of the constant current circuit 10, and the source of the NMOS transistor 13 is connected to one port of the switch circuit 16. Another port of the switch circuit 16 is connected to a ground terminal, and a control port of the switch circuit 16 is connected to an output port of the inverter 31. The drain of the NMOS transistor 14 is connected to another port of the constant current circuit 11, the gate of the NMOS transistor 14 is connected to the gate of the NMOS transistor 13, and the source of the NMOS transistor 14 is connected to one port of the switch circuit 17. Another port of the switch circuit 17 is connected to a ground terminal, and a control port of the switch circuit 17 is connected to an output port of the inverter 30. One port of the capacitor 18 is connected to the source of the NMOS transistor 13 and another port of the capacitor 18 is connected to the drain of the NMOS transistor 14. The drain of the NMOS transistor 15 is connected to another port of the constant current circuit 12, the gate of the NMOS transistor 15 is connected to the drain of the NMOS transistor 14, and the source of the NMOS transistor 15 is connected to a ground terminal. An input port of the inverter 30 is connected to the drain of the NMOS transistor 15. An input port of the inverter 31 is connected to the output port of the inverter 30, and the output port of the inverter 31 is connected to an output port of the oscillation circuit 100.

The oscillation circuit 100 of FIG. 1 controls turn-on and turn-off of the switch circuits 16 and 17 by signals CLK and CLKB, and charges and discharges the capacitor 18 by constant currents $I_{10}$ and $I_{11}$ of the constant current circuits 10 and 11 to output the signal CLK.

Herein, the oscillation circuit 100 of FIG. 1 is designed with the following conditions.

If the duty ratio of the signal CLK is set to 50%, the constant current $I_{10}$ and the constant current $I_{11}$ are equal. However, these constant currents may be appropriately set according to the desired duty ratio of the signal CLK. Further, a voltage V1 of a node N1 when the switch circuit 17 is turned on, i.e., $\Delta Vgs=Vgs_{14}-Vgs_{13}$, is a positive value.

The oscillation circuit 100 configured as described above operates as follows.

Figure 3:
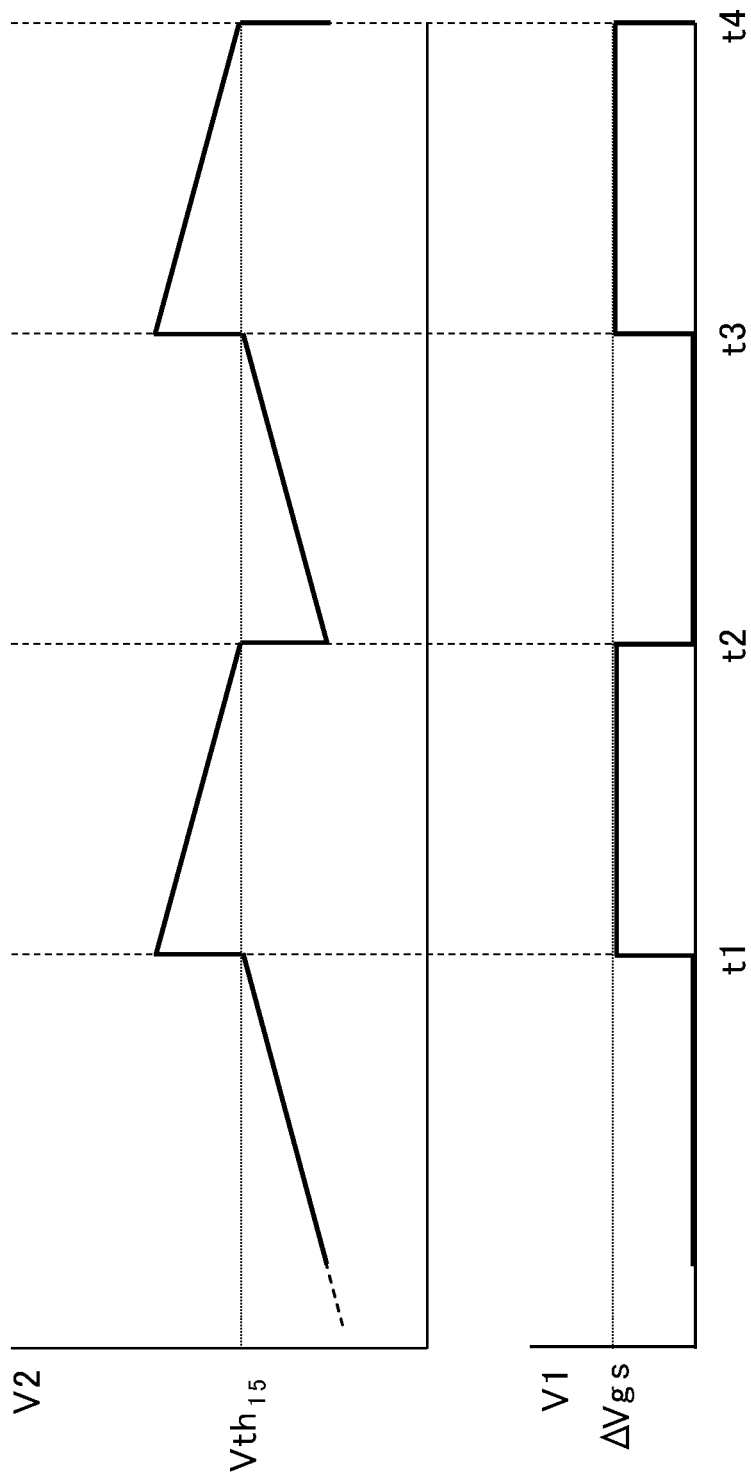
FIG. 3 is a timing chart illustrating the operation of the oscillation circuit of the present embodiment.
Figure 4:
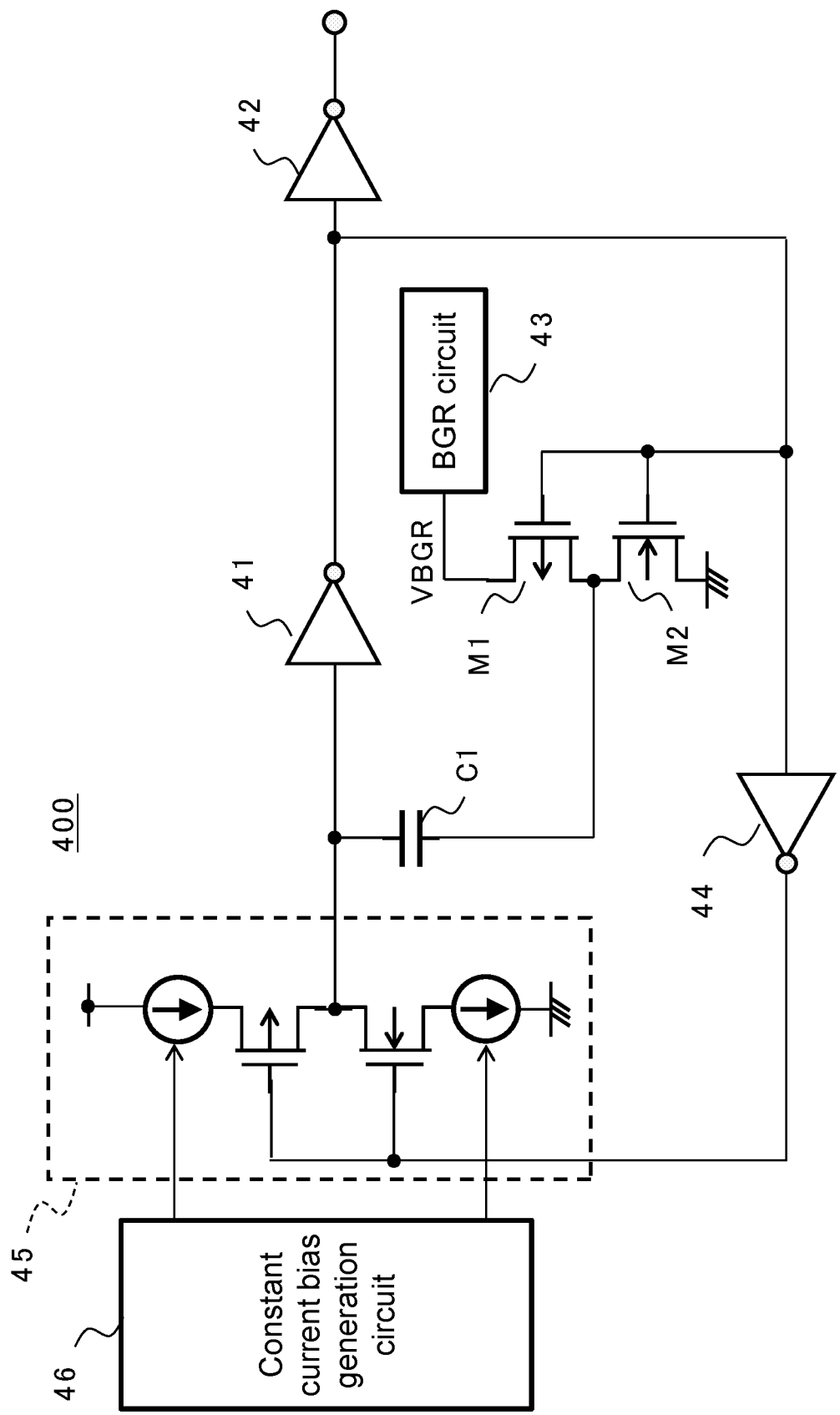
FIG. 4 is a block diagram illustrating a conventional oscillation circuit.

FIG. 3 is a timing chart illustrating the operation of the oscillation circuit 100.

First, the section from an initial state to a time t1 will be described.

In the initial state, the capacitor 18 is not charged. When a power supply is applied, the signal CLK becomes H level and the signal CLKB becomes L level, so that the switch circuit 16 is turned on and the switch circuit 17 is turned off. Therefore, the voltage V1 of the node N1 becomes the voltage of the ground terminal, i.e., L level.

The capacitor 18 is charged by the constant current $I_{11}$ flowing from a node N2 to the node N1. Then, a voltage V2 of the node N2, which is the voltage of the capacitor 18, gradually rises. At the time t1, when the voltage V2 reaches a threshold value $Vth_{15}$ of the NMOS transistor 15, the NMOS transistor 15 is turned on. Therefore, the signal CLK becomes L level and the signal CLKB becomes H level.

Next, the section from the time t1 to a time t2 will be described.

At the time t1, when the signal CLK becomes L level and the signal CLKB becomes H level, the switch circuit 16 is turned off and the switch circuit 17 is turned on. With the constant current $I_{10}$ flowing, the NMOS transistor 13 generates a voltage $Vgs_{13}$ between the gate and the source. With the constant current $I_{10}$ via the capacitor 18 and the constant current $I_{11}$ flowing, the NMOS transistor 14 generates a voltage $Vgs_{14}$ between the gate and the source. Therefore, the voltage V1 of the node N1 becomes $\Delta Vgs=Vgs_{14}-Vgs_{13}$. Herein, the NMOS transistor 13 and the NMOS transistor 14 may be designed so that the voltage $\Delta Vgs$ at this time becomes a positive value.

Since the voltage V1 becomes the voltage $\Delta Vgs$, the voltage V2 of the node N2 is raised by the voltage $\Delta Vgs$ due to the capacitor 18 and becomes $Vth_{15}+\Delta Vgs$. Then, with the switch circuit 17 turned on, the voltage charged in the capacitor 18 is discharged to the ground terminal via the NMOS transistor 14. The discharge current at this time is a current corresponding to the constant current $I_{10}$ of the constant current circuit 10.

That is, the voltage V2, which is the voltage of the capacitor 18 being the voltage $Vth_{15}+\Delta Vgs$ at the time t1, is discharged by the constant current $I_{10}$ and gradually drops. Then, at the time t2, when the voltage V2 falls below the threshold value $Vth_{15}$ of the NMOS transistor 15, the NMOS transistor 15 is turned off. Therefore, the signal CLK becomes H level and the signal CLKB becomes L level.

Next, the section from the time t2 to a time t3 will be described.

At the time t2, when the signal CLK becomes H level and the signal CLKB becomes L level, the switch circuit 16 is turned on and the switch circuit 17 is turned off. When the switch circuit 16 is turned on, the voltage V1 of the node N1 changes from $\Delta Vgs$ to the voltage of the ground terminal. The voltage V2 of the node N2 is lowered by the voltage $\Delta Vgs$ due to the capacitor 18 and becomes $Vth_{15}-\Delta Vgs$.

Then, by repeating the same operation after a time t4, the oscillation circuit 100 outputs a signal CLK having a duty ratio of 50% to the output port.

Figure 2:
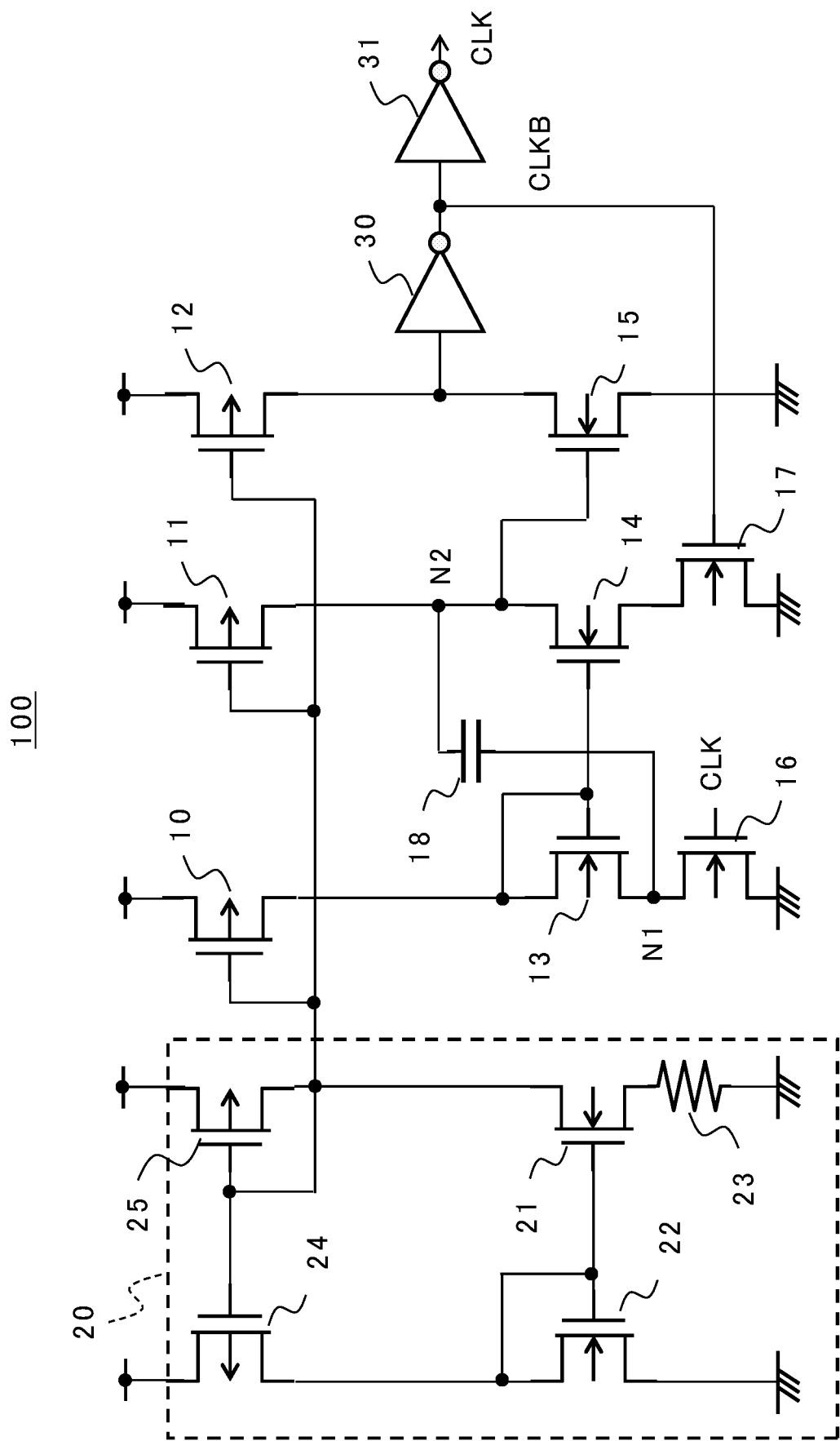
FIG. 2 is a circuit diagram illustrating an example of the oscillation circuit of the present embodiment.

FIG. 2 is a circuit diagram illustrating an example of the oscillation circuit 100 of the present embodiment.

The constant current circuits 10, 11, and 12 are composed of a bias circuit 20 and PMOS transistors 10, 11, and 12. The PMOS transistors 10 and 11 are designed to pass the same current and have the same size. The switch circuits 16 and 17 are composed of NMOS transistors 16 and 17.

The bias circuit 20 includes NMOS transistors 21 and 22, a resistor 23, and PMOS transistors 24 and 25. The source of the NMOS transistor 21 is connected to a ground terminal via the resistor 23. The source of the NMOS transistor 22 is connected to a ground terminal, and the drain and the gate of the NMOS transistor 22 are connected to the gate of the NMOS transistor 21. The source of the PMOS transistor 24 is connected to a power supply terminal, and the drain of the PMOS transistor 24 is connected to the drain of the NMOS transistor 22. The source of the PMOS transistor 25 is connected to a power supply terminal, and the drain and the gate of the PMOS transistor 25 are connected to the gate of the PMOS transistor 24 and the drain of the NMOS transistor 21.

In the bias circuit 20 configured as described above, if the current flowing to the PMOS transistor 25 is set as $I_{25}$, $I_{25}=\Delta Vgs_{-B}/R$. $\Delta Vgs_{-B}$ is the difference between the Vgs's of the NMOS transistors 21 and 22, and R is the resistance value of the resistor 23.

A frequency f of the signal CLK of the oscillation circuit 100 is expressed as follows.

$$f=(I/I_{25})(\Delta Vgs_{-B}/\Delta Vgs)/2CR$$

I is the current flowing through the constant current circuits 10 and 11, and C is the capacitance value of the capacitor 18. Herein, if the currents I and $I_{25}$ are designed to be equal and the voltage differences $\Delta Vgs_{-B}$ and $\Delta Vgs$ are designed to be equal, the frequency f is determined by the capacitance value of the capacitor 18 and the resistance value of the resistor 23.

That is, the frequency f of the signal CLK of the oscillation circuit 100 may not be affected by variations in the characteristics of the MOS transistors and may not be affected by fluctuations in the power supply voltage and the temperature, and a constant frequency f may be outputted. As can be clearly understood from the equation, the frequency f can have improved characteristics by using a resistor having good temperature characteristics.

As described above, the oscillation circuit 100 of the present embodiment is composed of the NMOS transistors 13 and 14 and the switch circuits 16 and 17 which raise and lower the voltage of the capacitor 18 by a constant voltage ($\Delta Vgs$), and the constant current circuits 10 and 11 which charge and discharge the capacitor 18 by a constant current. Therefore, even if the circuit scale is small and the current consumption is small, a constant frequency can be outputted without being affected by fluctuations in the power supply voltage and the temperature.

Although the embodiment of the present invention has been described above, the present invention is not limited to the above embodiment, and various modifications may be made without departing from the spirit of the present invention. For example, it is also possible to operate as a configuration in which the entire circuit is inverted with respect to the power supply terminal and the ground terminal, and the same effect can be obtained. In this case, the circuit is configured so that the PMOS transistors and the NMOS transistors are exchanged.

What is claimed is:

1. An oscillation circuit comprising:
   a capacitor;
   a first constant current circuit connected between a first power supply terminal and one port of the capacitor;
   a first switch circuit connected between another port of the capacitor and a second power supply terminal;
   a second constant current circuit having one port connected to the first power supply terminal;
   a first MOS transistor having a gate and a drain connected to another port of the second constant current circuit and a source connected to the another port of the capacitor;
   a second MOS transistor having a gate connected to the gate of the first MOS transistor and a drain connected to the one port of the capacitor;
   a second switch circuit connected between a source of the second MOS transistor and the second power supply terminal; and
   an output port which outputs a signal based on a voltage of the one port of the capacitor,
   wherein turn-on and turn-off of the first switch circuit and the second switch circuit are controlled by the signal of the output port and an inverted signal of the signal.

2. The oscillation circuit according to claim 1, wherein the first constant current circuit and the second constant current circuit are composed of a bias circuit, and a third MOS transistor and a fourth MOS transistor through which a current based on a current flowing through the bias circuit flows.

3. The oscillation circuit according to claim 2, wherein the bias circuit comprises:
   a fifth MOS transistor having a gate and a drain connected to each other and a source connected to the second power supply terminal;
   a sixth MOS transistor having a gate connected to the gate of the fifth MOS transistor and a source connected to the second power supply terminal via a resistor;
   a seventh MOS transistor having a drain connected to the drain of the fifth MOS transistor and a source connected to the first power supply terminal; and
   an eighth MOS transistor having a source connected to the first power supply terminal, and a gate and a drain connected to a drain of the sixth MOS transistor, a gate of the seventh MOS transistor, and gates of the third MOS transistor and the fourth MOS transistor.

* * * * *